United States Patent
Dang et al.

(10) Patent No.: US 9,586,291 B2
(45) Date of Patent: Mar. 7, 2017

(54) ADHESIVES FOR BONDING HANDLER WAFERS TO DEVICE WAFERS AND ENABLING MID-WAVELENGTH INFRARED LASER ABLATION RELEASE

(71) Applicant: GLOBALFOUNDRIES INC., Grand Cayman (KY)

(72) Inventors: Bing Dang, Chappaqua, NY (US); John U. Knickerbocker, Yorktown Heights, NY (US); Eric Peter Lewandowski, White Plains, NY (US); Cornelia Kang-I Tsang, Mohegan Lake, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 0 days.

(21) Appl. No.: 14/226,953

(22) Filed: Mar. 27, 2014

(65) Prior Publication Data

US 2015/0035173 A1     Feb. 5, 2015

Related U.S. Application Data

(60) Provisional application No. 61/861,034, filed on Aug. 1, 2013.

(51) Int. Cl.
*H01L 21/302* (2006.01)
*B23K 26/36* (2014.01)
(Continued)

(52) U.S. Cl.
CPC .......... *B23K 26/36* (2013.01); *G01R 31/2607* (2013.01); *H01L 21/302* (2013.01);
(Continued)

(58) Field of Classification Search
CPC ....... H01L 2924/00014; H01L 2924/00; H01L 2224/48091; H01L 2224/97;
(Continued)

(56) References Cited

U.S. PATENT DOCUMENTS

| 5,871,884 A | 2/1999 | Ellis |
| 6,284,425 B1 | 9/2001 | Staral et al. |

(Continued)

FOREIGN PATENT DOCUMENTS

| CN | 102077326 A | 5/2011 |
| EP | 0131375 A1 | 1/1985 |

(Continued)

OTHER PUBLICATIONS

B. Dang et al., "CMOS Compatible Thin Wafer Processing Using Temporary Mechanical Wafer, Adhesive and Laser Release of Thin Chips/Wafers for 3D Integration," IEEE 60th Electronic Components and Technology Conference (ECTC), Jun. 2010, pp. 1393-1398.

(Continued)

*Primary Examiner* — Tony Tran
(74) *Attorney, Agent, or Firm* — Scully Scott Murphy and Presser; Frank DiGiglio

(57) ABSTRACT

Methods are provided to form adhesive materials that are used to temporarily bond handler wafers to device wafers, and which enable mid-wavelength infrared laser ablation release techniques to release handler wafers from device wafers.

13 Claims, 8 Drawing Sheets

(51) Int. Cl.
*G01R 31/26* (2014.01)
*H01L 21/683* (2006.01)

(52) U.S. Cl.
CPC .. *H01L 21/6835* (2013.01); *H01L 2221/6834* (2013.01); *H01L 2221/68318* (2013.01); *H01L 2221/68327* (2013.01); *H01L 2221/68381* (2013.01); *Y10T 156/1158* (2015.01); *Y10T 156/1917* (2015.01); *Y10T 428/265* (2015.01); *Y10T 428/30* (2015.01); *Y10T 428/31678* (2015.04)

(58) Field of Classification Search
CPC . H01L 2924/12041; H01L 2924/00013; H01L 2924/0665; H01L 2924/0002; H01L 2924/10253; H01L 2924/12042; H01L 2924/00015; H01L 2224/245
See application file for complete search history.

(56) References Cited

U.S. PATENT DOCUMENTS

| | | | |
|---|---|---|---|
| RE40,601 E | 12/2008 | Inoue et al. | |
| 8,003,483 B2 | 8/2011 | Suzawa et al. | |
| 8,181,688 B2 | 5/2012 | Johnson et al. | |
| 8,241,536 B2 | 8/2012 | Jiang et al. | |
| 2004/0087110 A1 | 5/2004 | Takayama et al. | |
| 2005/0233547 A1 | 10/2005 | Noda et al. | |
| 2005/0282357 A1 | 12/2005 | Takayama et al. | |
| 2006/0131703 A1 | 6/2006 | Majumdar et al. | |
| 2006/0270189 A1 | 11/2006 | Ogita et al. | |
| 2007/0010067 A1 | 1/2007 | Shimoda et al. | |
| 2007/0099413 A1 | 5/2007 | Shiu et al. | |
| 2007/0231568 A1 * | 10/2007 | Kanakarajan | 428/343 |
| 2008/0124839 A1 | 5/2008 | Saiki et al. | |
| 2008/0176046 A1 | 7/2008 | Yamaguchi et al. | |
| 2008/0268618 A1 | 10/2008 | Yamazaki | |
| 2009/0029152 A1 | 1/2009 | Yun et al. | |
| 2009/0117707 A1 | 5/2009 | Shimomura et al. | |
| 2009/0239354 A1 | 9/2009 | Suzawa et al. | |
| 2009/0275196 A1 | 11/2009 | Yamazaki et al. | |
| 2010/0171138 A1 | 7/2010 | Yamazaki et al. | |
| 2010/0263794 A1 | 10/2010 | George et al. | |
| 2010/0330788 A1 | 12/2010 | Yu et al. | |
| 2011/0010908 A1 | 1/2011 | George et al. | |
| 2011/0073847 A1 | 3/2011 | Kobayashi et al. | |
| 2011/0300356 A1 | 12/2011 | Takamatsu et al. | |
| 2012/0034437 A1 | 2/2012 | Puligadda et al. | |
| 2012/0080150 A1 | 4/2012 | Riege et al. | |
| 2012/0118511 A1 | 5/2012 | Imai et al. | |
| 2012/0219609 A1 | 8/2012 | Howland | |
| 2012/0268817 A1 | 10/2012 | Kozlov | |
| 2014/0077199 A1 | 3/2014 | Yamazaki et al. | |
| 2014/0144593 A1 | 5/2014 | Dang et al. | |

FOREIGN PATENT DOCUMENTS

| | | |
|---|---|---|
| KR | 20110103193 A | 9/2011 |
| WO | 2011010030 A1 | 7/2011 |
| WO | 2011100030 A1 | 8/2011 |

OTHER PUBLICATIONS

PCT International Search Report and Written Opinion, dated Oct. 29, 2014, for counterpart PCT Application PCT/CN2014/083198.
PCT International Search Report and Written Opinion, dated Oct. 28, 2014, for related PCT Application PCT/CN2014/083196.

* cited by examiner

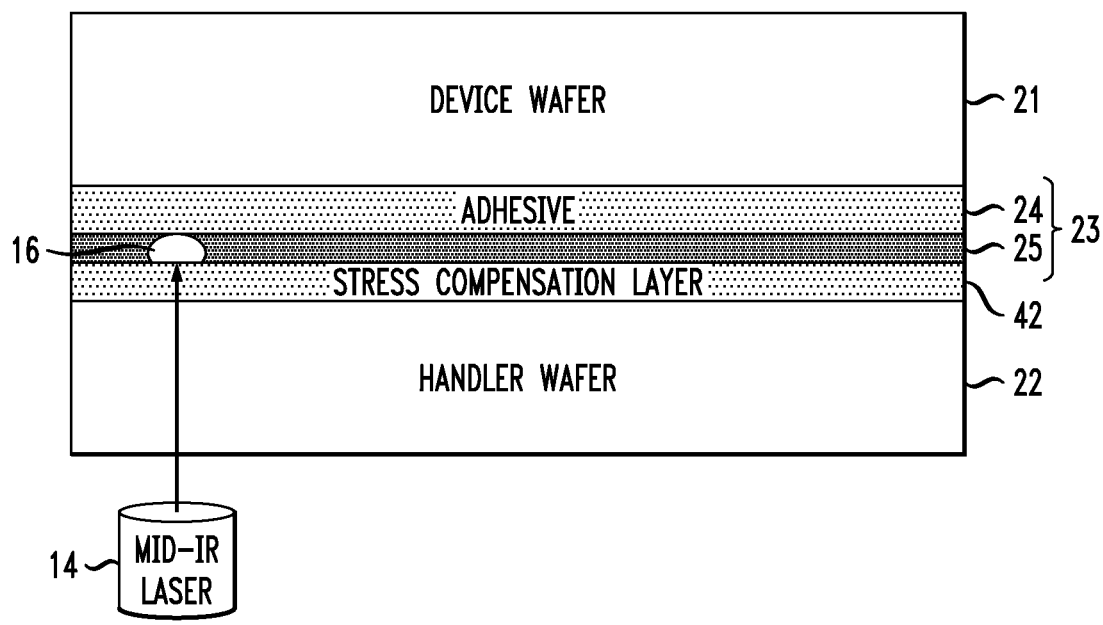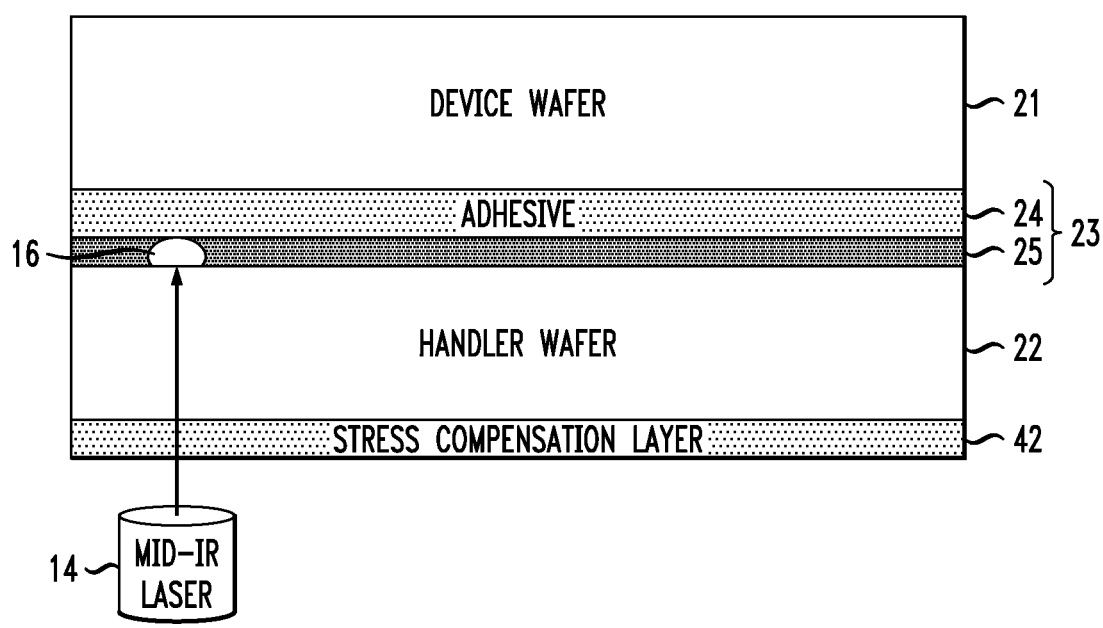

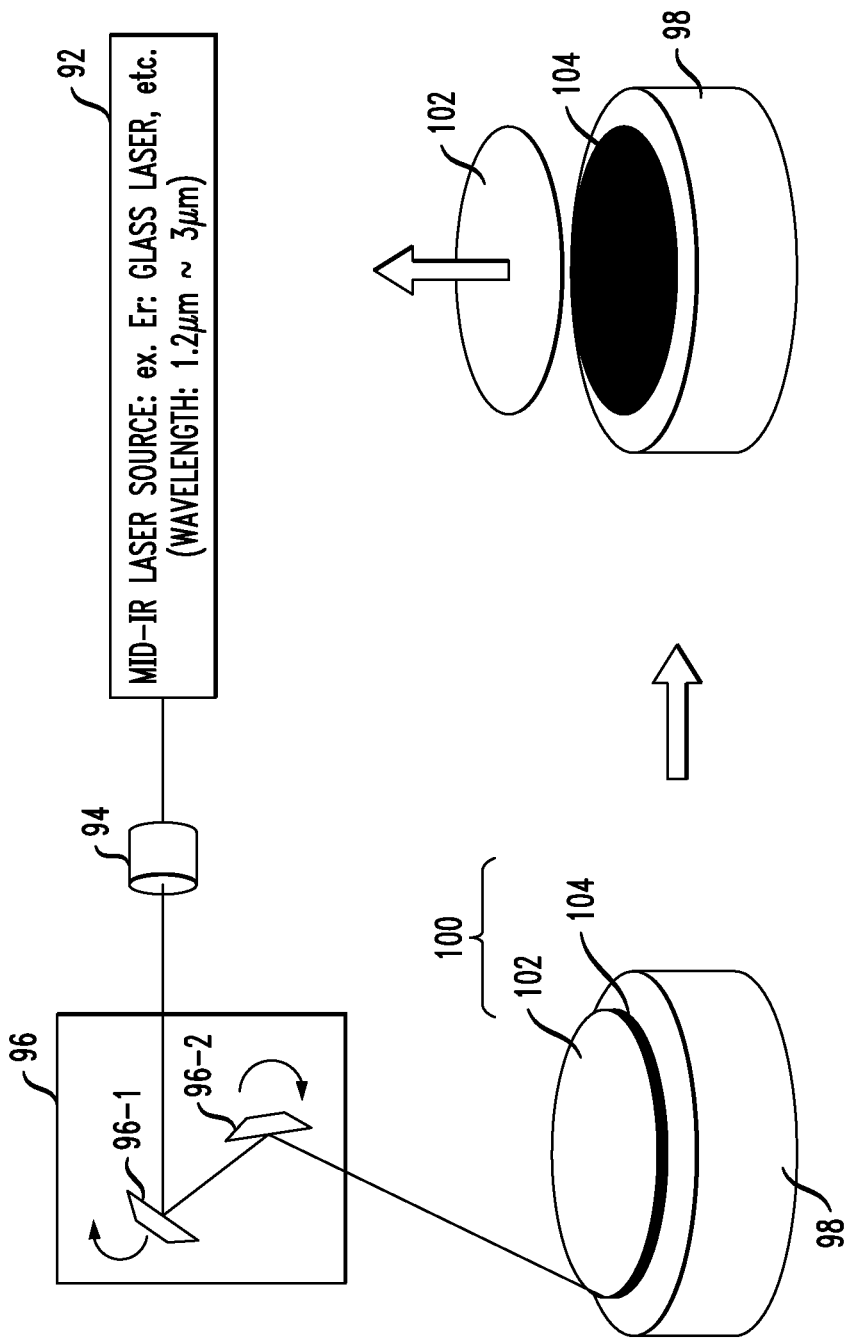

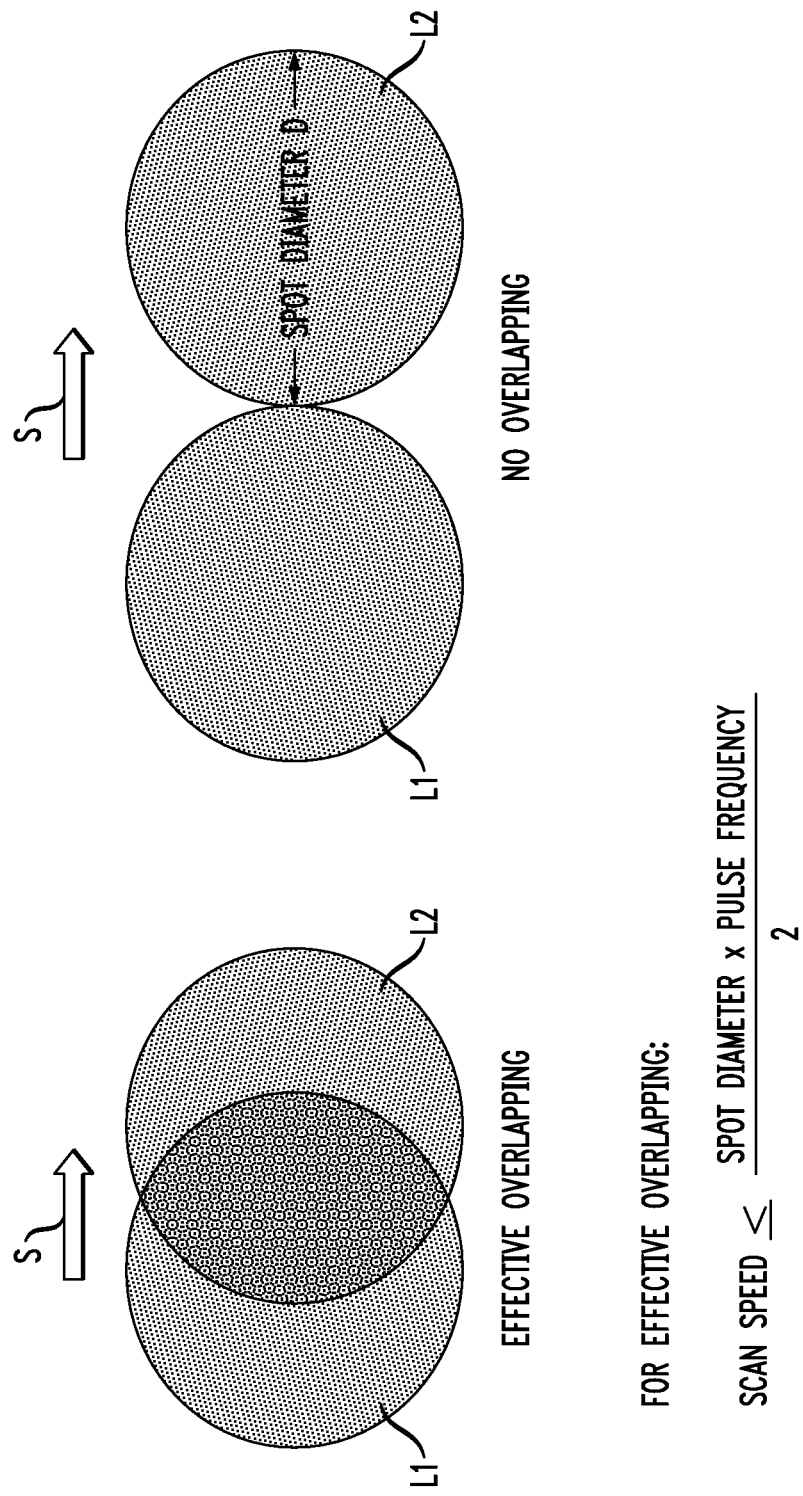

ADHESIVES FOR BONDING HANDLER WAFERS TO DEVICE WAFERS AND ENABLING MID-WAVELENGTH INFRARED LASER ABLATION RELEASE

CROSS-REFERENCE TO RELATED APPLICATIONS

This application claims priority to U.S. Provisional Application Ser. No. 61/861,034, filed on Aug. 1, 2013, the disclosure of which is incorporated herein by reference. This application is related to U.S. patent application Ser. No. 14/266,966, filed concurrently herewith, U.S. patent application Ser. No. 13/687,531, filed on Nov. 28, 2012, and U.S. patent application Ser. No. 13/746,359, filed on Jan. 22, 2013, the disclosures of which are incorporated herein by reference.

TECHNICAL FIELD

The field generally relates to wafer handling techniques and, in particular, to methods for forming adhesive materials that are used to temporarily bond handler wafers to device wafers, and which enable mid-wavelength infrared laser ablation release techniques to release handler wafers from device wafers.

BACKGROUND

In the field of semiconductor wafer processing, increasing demands for large-scale integration, high density silicon packages has resulted in making semiconductor dies very thin. For example, for some applications, silicon (Si) wafers are backside ground and polished down to a thickness of 50 µm or thinner. Although single crystal Si has very high mechanical strength, Si wafers and/or chips can become fragile as they are thinned. Defects can also be introduced by processing steps such as through-silicon via (TSV) processing, polishing, and dicing, which further reduces the mechanical strength of a thinned wafer or chip. Therefore, handling thinned Si wafers presents a significant challenge to most automation equipment.

In order to facilitate the processing of a device wafer, a mechanical handler wafer (or carrier wafer) is usually attached to the device wafer to enhance the mechanical integrity of the device wafer during processing. When processing of the device wafer is complete, the handler wafer needs to be released from the device wafer. The most common approach to handling a device wafer is to laminate the handler wafer with the device wafer using specially developed adhesives. Depending on factors such as the processing steps, the product requirements, and the type of the adhesive, various techniques have been used or proposed to debond or separate a thinned device wafer from a mechanical handler wafer, including thermal release, chemical dissolving, mechanical release, and laser ablation techniques.

A typical laser-assisted debonding process uses a polymeric adhesive (which is capable of sufficient absorption of energy in the UV (ultra violet) spectrum) to bond a device wafer to a UV transparent glass handler wafer. A laser ablation process is performed to ablate the polymeric adhesive and achieve debonding between the glass handler wafer and the device wafer. The use of a glass handler in the UV laser ablation process has several drawbacks including poor thermal conductivity, incompatibility with certain semiconductor processing equipment, as well as high cost. Although the use of Si wafer handlers can potentially overcome these drawbacks, silicon is not transparent to the UV spectrum and therefore is not compatible with previously developed UV laser release technology.

SUMMARY

In general, embodiments of the invention include methods for forming adhesive materials that are used to temporarily bond handler wafers to device wafers, and which enable mid-wavelength infrared laser ablation release techniques to release handler wafers from device wafers.

In one embodiment of the invention, a method for forming an adhesive includes mixing a quantity of filler particles, solvent, and surfactant to obtain a first mixture in which the filler particles are uniformly dispersed, mixing a quantity of adhesive material with the first mixture to generate a second mixture, and vacuum mixing the second mixture to achieve a target viscosity that is effective for deposition coating the second mixture onto a substrate.

In one embodiment, the filler particles are formed of a material that absorbs infrared energy having a wavelength in a range of about 1.12 µm to about 5 µm, wherein such filler particles may be metallic particles or carbon particles, for example.

In another embodiment, the filler particles are formed of a material that reflects infrared energy having a wavelength in a range of about 1.12 µm to about 5 µm, wherein such filler particles may be alumina, boron nitride, and silica particles, ceramic spheres, or a combination thereof, for example.

In another embodiment of the invention, a stack structure includes a device wafer, a handler wafer, and a bonding structure disposed between the device wafer and the handler wafer, wherein the bonding structure bonds the device wafer and the handler wafer together. The bonding structure includes a release layer formed of conductive material, and a bonding adhesive layer. The release layer is configured to be substantially or completely vaporized by infrared ablation when exposed to infrared laser energy through the handler wafer to cause the release of the device wafer from the handler wafer as a direct result of the infrared ablation of the release layer. The bonding adhesive layer includes filler particles that are configured to reflect the infrared laser energy away from the device wafer toward the release layer, wherein a wavelength of the infrared laser energy is in a range of about 1.12 µm to about 5 µm.

In yet another embodiment of the invention, a stack structure includes a device wafer, a handler wafer, and a bonding structure disposed between the device wafer and the handler wafer, wherein the bonding structure bonds the device wafer and the handler wafer together. The bonding structure includes a release layer formed of a bonding adhesive. The bonding adhesive includes filler particles that are formed of a material that absorbs infrared laser energy having a wavelength in a range of about 1.12 µm to about 5 µm. The release layer is configured to be substantially or completely vaporized by infrared laser ablation when exposed to infrared laser energy through the handler wafer to cause the release of the device wafer from the handler wafer as a direct result of the infrared ablation of the release layer.

These and other embodiments of the invention will be described in the following detailed description of embodiments, which is to be read in conjunction with the accompanying drawings.

BRIEF DESCRIPTION OF THE DRAWINGS

FIG. 4 schematically depicts a stack structure comprising a bonding structure for temporarily bonding a device wafer to a handler wafer, according to another embodiment of the invention.

FIG. 5 schematically depicts a stack structure comprising a bonding structure for temporarily bonding a device wafer to a handler wafer, according to another embodiment of the invention.

FIG. 9 schematically depicts an apparatus to perform a laser debonding process to release a device wafer and handler wafer using mid-wavelength infrared energy, according to an embodiment of the invention.

FIG. 11 illustrates a method for effectively overlapping pulsed laser bean spots during an IR laser scan process to effectively ablate a release layer, according to an embodiment of the invention.

DETAILED DESCRIPTION

Figure 1:
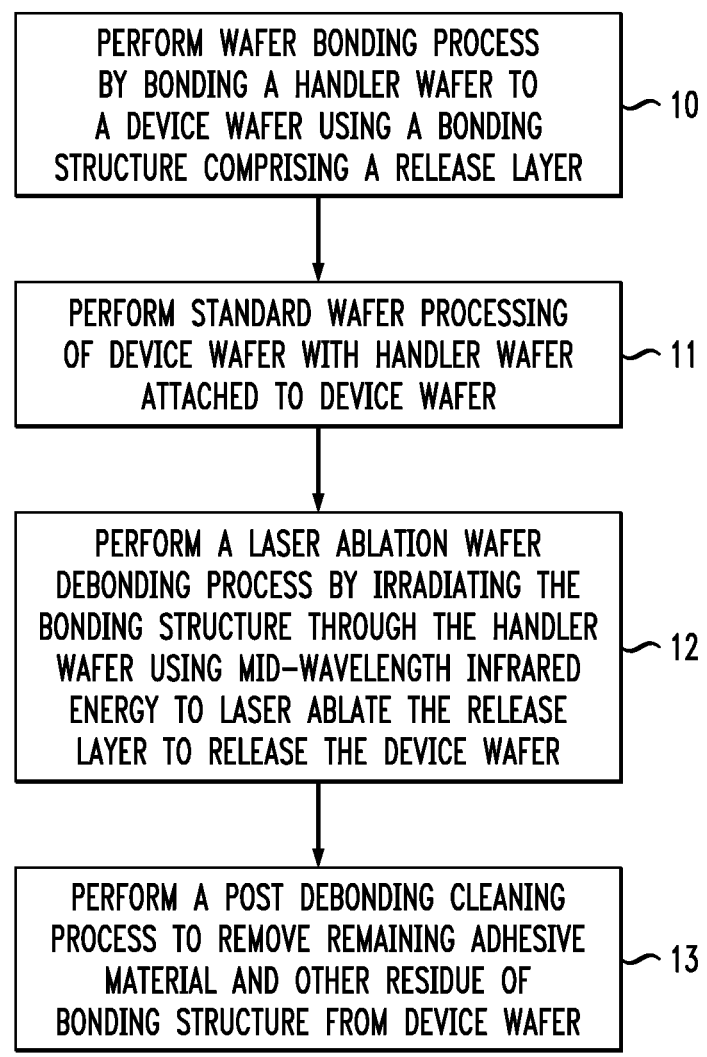
FIG. 1 is flow diagram of a method for processing and handling a semiconductor wafer according to an embodiment of the invention.

Embodiments of the invention will now be discussed in further detail with regard to structures and methods for temporarily bonding handler wafers to device wafers using bonding structures that include one or more releasable layers that absorb mid-wavelength infrared radiation ("Mid-IR radiation") to achieve wafer debonding by infrared radiation ablation. For example, FIG. 1 is flow diagram that illustrates a method for processing and handling a semiconductor wafer according to an embodiment of the invention. Referring to FIG. 1, the method includes performing a wafer bonding process by bonding a handler wafer (or handler substrate) to a device wafer using a bonding structure that comprises a release layer (step 10). In one embodiment of the invention, the handler wafer is a Si handler wafer (or substrate) which is bonded to a Si device wafer, as the use of a mechanical Si handler wafer enables compatibility with standard CMOS silicon wafer processing technologies. In other embodiments of the invention, the handler wafer can be formed of glass or other suitable materials that are transparent or semi-transparent (e.g., at least 50% transparent) to certain wavelengths in the infrared (IR) spectrum that is used for IR laser ablation.

Moreover, release layers according to embodiments of the invention include thin metallic layers and/or adhesive layers formed with metallic particles, which serve as releasable layers that can be substantially or completely ablated (vaporized) using low-power Mid-IR radiation to debond the device and handler wafers. In particular, in one embodiment, a bonding structure which temporarily bonds a handler wafer to a device wafer is formed with one or more release layers (e.g., thin metal film, adhesive with metallic particles) that are configured to strongly absorb Mid-IR energy emitted from a pulsed IR laser, and provide high ablation efficiency with low ablation energy thresholds to enable quick release of handler wafers from device wafers. Indeed, with these bonding structures, an ultra-short pulse of Mid-IR energy from the IR laser can be readily absorbed by the release layer(s) (constrained in a very shallow depth within the bonding structure) to thereby quickly and efficiently vaporize at least a portion of the release layer at an interface of the bonding structure and the handler wafer and thereby release the handler wafer from the device wafer. Various structures and methods for bonding handler wafers to device wafers will be described in further detail below with reference to FIGS. 2-8.

Referring again to FIG. 1, once the wafer bonding process is complete, standard wafer processing steps can be performed with the handler wafer attached to the device wafer (step 11). For instance, in one embodiment of the invention, the handler wafer is bonded to a BEOL (back-end-of-line) structure formed on an active surface of the device wafer. In this instance, standard wafer processing steps such as grinding/polishing the backside (inactive) surface of the device wafer to thin the device wafer can be performed. Other wafer processing steps include forming through-silicon-vias through the backside of the device wafer to the integrated circuits formed on the active side of the device wafer. Additional process steps may be employed to deposit thin films (such as, but not limited to, SiO2 and/or Si3N4) that by means of compressive or tensile force on the silicon substrate and/or handler wafer, help to minimize silicon active wafer and/or bonded pair non-planarity (or warp).

In other embodiments, the device wafer (having dicing tape on a surface thereof) may be subject to a wafer dicing process with the handler wafer attached such that an individual die, or multiple dies, can be held by the temporary handler wafer for die assembly or other processes where the dies are assembled to a substrate or another full thickness die, and then released in subsequent operations such as post assembly or post underfill. During these processing steps, the handler wafer will impart some structural strength and stability to the device wafer, as is readily understood by those of ordinary skill in the art.

A next step in the illustrative process of FIG. 1 involves performing a laser ablation wafer debonding process to release the device wafer from the handler wafer (step 12). In one embodiment, this process involves irradiating the bonding structure through the handler wafer using mid-wavelength IR energy to laser ablate a release layer of the bonding structure and release the device wafer. More specifically, in one embodiment, the process involves directing a pulsed Mid-IR laser beam at the handler wafer, and scanning the pulsed Mid-IR laser beam according to a predetermined scan pattern to laser ablate a release layer of the bonding structure. Laser ablation of the release layer comprise substantially or completely vaporizing at least a portion of the release layer (e.g., a thin metallic layer and/or an adhesive layer with metallic particles) at an interface between the release layer and the device wafer, to enable release of the device wafer from the handler wafer. In one embodiment of the invention, a Mid-IR laser ablation process is implemented using an infrared laser beam that emits Mid-IR radiation with a wavelength in a range of about 1.12 μm to about 5 μm, and more preferably, in a range of about 1.12 μm to about 3 μm. Various embodiments of a Mid-IR laser ablation process will be described in further detail below with reference to FIGS. 9-11.

Referring again to FIG. 1, once the Mid-IR laser ablation process is complete and the device wafer is released from the handler wafer, a post debonding cleaning process can be performed to remove any remaining adhesive material or other residue (resulting from the ablation of the bonding structure) from the device wafer (step 13). For example, cleaning process can be implemented using a chemical cleaning process or a wet cleaning process to remove any polymer based adhesive material. Other suitable cleaning methods to remove residue of the ablated bonding structure can be used, which are known to those of ordinary skill in the art.

The use of Mid-IR radiation to perform a laser ablation process according to embodiments of the invention provides many advantages as compared to using Far-IR radiation (greater than 5 microns) for laser ablation. For example, a laser ablation process using Mid-IR radiation is compatible with both Si and glass handlers and other handlers that are formed of materials that are transparent to Mid-IR radiation. In contrast, glass handlers are not transparent in the Far-IR spectrum and, consequently, cannot be utilized with Far-IR laser ablation techniques. Moreover, a laser ablation process using Mid-IR radiation is compatible with stress compensation layers (e.g., silicon oxide or silicon nitride layers) which are formed on thin handler wafers to prevent warping of the thin handler wafers during semiconductor processing stages. Furthermore, as compared to Far-IR radiation, the shorter wavelength of Mid-IR radiation enables higher absorption rates in thin release layers and thus, requires a much lower ablation threshold (e.g., 10 times lower energy) to achieve effective ablation (vaporization or removal) of the release layers. Another advantage of using Mid-IR radiation for ablation, as compared to Far-IR radiation, is that commercially available dicing tape products are transparent to Mid-IR radiation. As such, during a laser ablation process, when a layer of dicing tape is disposed on a surface of a device wafer, the dicing tape will not suffer thermal damage during a Mid-IR laser ablation process.

Figure 2:
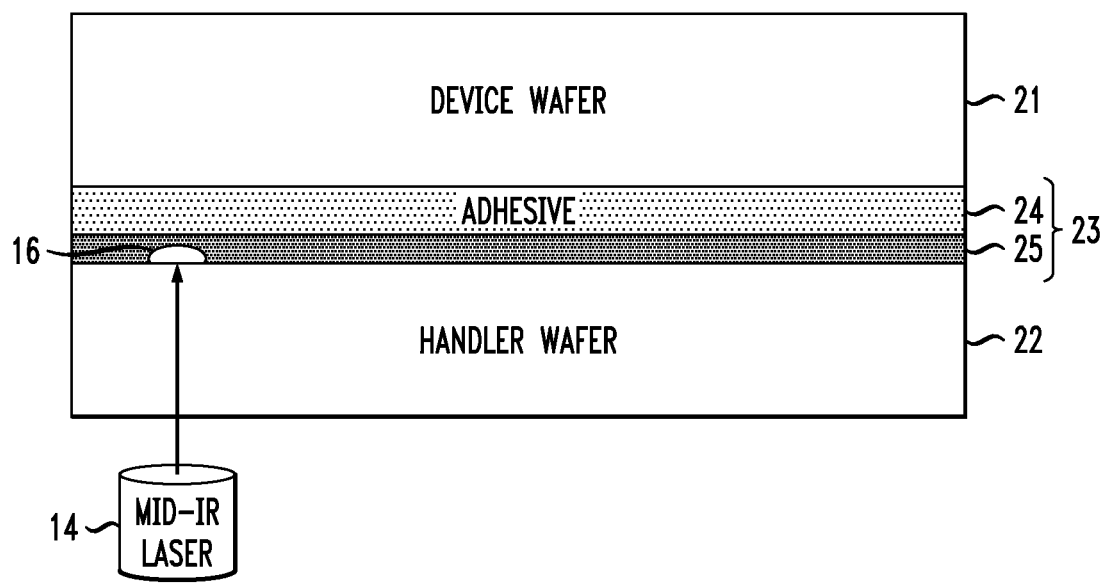
FIG. 2 schematically depicts a stack structure comprising a bonding structure for temporarily bonding a device wafer to a handler wafer, according to an embodiment of the invention.

FIG. 2 schematically depicts a stack structure comprising a bonding structure for temporarily bonding a device wafer to a handler wafer, according to an embodiment of the invention. More specifically, FIG. 2 is a schematic side view of a stack structure 20 comprising a device wafer 21, a handler wafer 22, and a bonding structure 23. The bonding structure 23 comprises an adhesive layer 24, and a release layer 25. FIG. 2 further illustrates a Mid-IR laser 14 that emits an IR laser beam at the handler wafer 22 to irradiate a portion of the release layer 25, resulting in a laser-ablated region 16.

In one embodiment of the invention, Mid-IR laser 14 emits a pulsed infrared laser beam to laser ablate the release layer 25, wherein the Mid-IR laser 14 emits a mid-wavelength infrared laser beam with a wavelength in a range of about 1.12 μm to about 5 μm, and more preferably, in a range of about 1.12 μm to about 3 μm. The handler wafer 22 may be a silicon wafer or a glass wafer, wherein both silicon and glass are at least approximately 50% transparent to IR radiation wavelengths of 1.12 μm to about 3 μm. As such, the IR laser beam will penetrate the handler wafer 22 and irradiate the release layer 25.

In one embodiment of the invention, the release layer 25 is formed of a metallic material having properties such as being reactive (not inert), soft, and having a relatively low melting point. For example, the release layer 25 may be formed of metallic materials such as aluminum (Al), tin (Sn) or zinc (Zn). In other embodiments, the release layer 25 is formed of carbon materials such as carbon nanotubes and graphene, for example. Depending on the material used for the release layer 25, the release layer 25 can be formed with a thickness in a range of about 5 nanometers to about 400 nanometers. For example, in one embodiment in which the release layer 25 is formed of a metallic material such as aluminum, the release layer 25 can be formed with a thickness in a range of about 5 nanometers to about 200 nanometers. In an embodiment in which the release layer 25 is formed of carbon material, the release layer 25 can be formed with a thickness of about 400 nanometers or less.

The ablation threshold of Mid-IR laser irradiation (level of exposure and time of exposure) for vaporizing the release layer 25 will vary depending on the thickness and type of material used to form the thin release layer 25. In all instances, the thin release layer 25 is configured to substantially absorb (and not reflect or transmit) the Mid-IR laser energy, so that ablation of the thin release layer 25 occurs.

In one embodiment, the adhesive layer 24 may be formed of any suitable polymer adhesive material that may or may not be capable of sufficiently absorbing the Mid-IR energy output from the IR laser 14. Irrespective of the IR absorption ability of the adhesive layer 24, in one embodiment of the invention, the release layer 25 is configured (in material composition and thickness) to intensely absorb the Mid-IR energy and serve as a primary releasable layer of the bonding structure 23, which is ablated by the IR laser energy. The release layer 25 improves the laser ablation efficiency and thus, reduces the ablation threshold of the bonding structure 23 (as compared to a bonding structure that uses an adhesive layer alone). In one embodiment of the invention, the release layer 25 is irradiated with infrared energy sufficient to fully vaporize (ablate) a portion of the release layer 25 that is exposed to the Mid-IR energy, or at lease fully vaporize the material of the release layer 25 at the interface between the handler wafer 22 and the release layer 25 so as release the handler wafer 22.

Moreover, in an alternate embodiment of the invention, the bonding structure 23 is irradiated with Mid-IR energy sufficient to fully vaporize (ablate) at least a portion of the thin release layer 25 that is exposed to the Mid-IR energy, as well as vaporize, denature, carbonize, or otherwise ablate and at least a portion of the adhesive layer 24 at an interface between the adhesive layer 24 and the portion of the release layer 25 that is irradiated and ablated. In other words, in the bonding structure 23 shown in FIG. 2, the portion of the release layer 25 that is irradiated by the Mid-IR laser 14 is heated and vaporized, and this heating and ablation of the thin release layer 25 results in heating of the surrounding material of the adhesive layer 24 (at the interface between the irradiated release layer 25 and adhesive layer 24), which causes ablation of the adhesive layer 24. In addition, depending on the IR absorption properties of the material used to form the adhesive layer 24, ablation of the adhesive layer 24 is further achieved by any additional heating that is due to absorption of the Mid-IR energy by the adhesive layer 24.

In one embodiment of the invention, the stack structure 20 can be fabricated as follows. Initially, the release layer 25 is formed on a surface of the handler wafer 22. For example, the release layer 25 may be formed by depositing a layer of metallic material (e.g., Al) using a standard technique such as chemical vapor deposition (CVD), physical vapor deposition (PVD), or atomic layer deposition (ALD). In other embodiments, the release layer 25 can be formed by growing or otherwise placing a layer of carbon material (e.g., carbon nanotubes, graphene layer, etc.) on a surface of the handler wafer 22 using known techniques.

A next step includes forming the adhesive layer 24 on the release layer 25. The adhesive layer 24 can be formed using known materials and deposition techniques. For instance, the adhesive layer 24 can be formed of any suitable polymeric adhesive material, high-temperature thermoplastic polyimides, BCB, acrylics, epoxies, or other bonding adhesive materials that are suitable for the given application. The adhesive layer 24 can be formed by spin coating the adhesive material on the release layer 25, and thermally baking the adhesive material to form the adhesive layer 24. Thereafter, a standard bonding process is implemented to bond the handler wafer 22 (with the bonding structure 23) to the device wafer 21.

Figure 3:
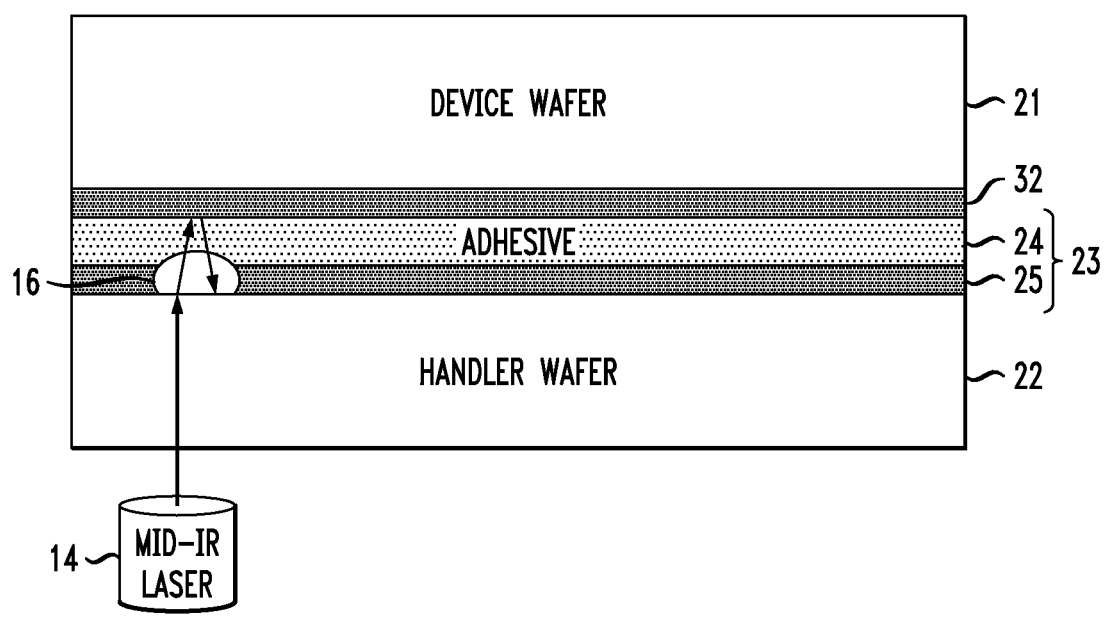
FIG. 3 schematically depicts a stack structure comprising a bonding structure for temporarily bonding a device wafer to a handler wafer, according to another embodiment of the invention.

FIG. 3 schematically depicts a stack structure comprising a bonding structure for temporarily bonding a device wafer to a handler wafer, according to another embodiment of the invention. More specifically, FIG. 3 is a schematic side view of a stack structure 30 which is similar to the stack structure 20 of FIG. 2, except that in the embodiment of FIG. 3, a protective layer 32 is disposed between the bonding structure 23 and the device wafer 21. The adhesive layer 24 and the release layer 25 shown in FIG. 3 may be formed of the same or similar materials as discussed above with reference to FIG. 2.

In the embodiment of FIG. 3, the protective layer 32 serves to protect the device wafer 21 from being irradiated with the infrared energy emitted from the Mid-IR laser 14 during a laser ablation process. More specifically, the protective layer 32 is configured (in material composition and thickness) to reflect incident Mid-IR laser energy away from the device layer 21 back toward the release layer 25. In one embodiment of the invention, the protective layer 32 may be formed of an inert metallic material such as titanium, chromium, gold or copper, with a thickness that is sufficient to reflect the Mid-IR energy (thicker than a skin depth of the protective layer 32 at the given Mid-IR laser wavelength). For example, the protective layer 32 may be formed of a metallic material such as Ti with a thickness in range of about 50 nm to about 500 nm. In the embodiment of FIG. 3, the ablation efficiency of the irradiated portion of the release layer 25 (and adhesive material) in the laser-ablated region 16 is further enhanced by the additional Mid-IR irradiation reflected back from the protective layer 32, as schematically depicted in FIG. 3.

In one embodiment of the invention, the stack structure 30 can be fabricated using similar methods as discussed above with reference to FIG. 2. Initially, the release layer 25 is formed on a surface of the handler wafer 22 followed by forming the adhesive layer 24 on the release layer 25, using materials and techniques as discuss above with reference to FIG. 2. Next, the protective layer 32 is formed on a surface of the device wafer 21 using suitable metallic materials and known deposition techniques. Thereafter, a standard bonding process is implemented to bond the handler wafer 22 (with the bonding structure 23) to the device wafer 21 (with the protective layer 32) to construct the resulting stack structure shown in FIG. 3.

FIG. 4 schematically depicts a stack structure comprising a bonding structure for temporarily bonding a device wafer to a handler wafer, according to another embodiment of the invention. More specifically, FIG. 4 is a schematic side view of a stack structure 40 which is similar to the stack structure 20 of FIG. 2, except that in the embodiment of FIG. 4, a stress compensation layer 42 is formed on a surface of the handler wafer 22 and disposed between the bonding structure 23 and the handler wafer 22. The adhesive layer 24 and the release layer 25 shown in FIG. 4 may be formed of the same or similar materials as discussed above with reference to FIG. 2. In the embodiment of FIG. 4, the stress compensation layer 42 serves to prevent warping of stack structure 40, which can result due to lateral stresses that are applied to the different layers of the stack structure 40 during the semiconductor fabrication processing stages that are performed to build the stack structure 40 and/or process the device wafer 21 while attached to the handler wafer 22.

In this embodiment, the stress compensation layer 42 is configured (in material composition and thickness) to counteract stress forces that could otherwise be applied to the layers of the stack structure 40 potentially causing the stack structure 40 to warp. In addition, the stress compensation layer 42 is configured (in material composition and thickness) to be transparent to the wavelength of the Mid-IR laser radiation used in the laser ablation process so that the Mid-IR energy will pass through the stress compensation layer 42 to irradiate the release layer 25.

In one embodiment of the invention, the stress compensation layer 42 may be formed of a silicon oxide material (e.g., SiO2) or a silicon nitride material (e.g., Si3N4), for example. The stress compensation layer 42 is preferably formed with a thickness in a range of about 100 nm to about 5000 nm, wherein the thickness will depend on the material used and the amount of stress counteraction force needed to prevent warping of the stack structure 40 for the given application. In general, while silicon substrates are relatively strong and are typically not subject to warping, relatively thin silicon substrates (e.g., a thinned silicon device wafer) can be susceptible to warping. On the other hand, handler wafers made of glass or other materials, are not as strong as silicon handlers, and are more susceptible to warping. Thus, the implementation and composition of the compensation layer 42 will depend on factors such as, for example, the material composition and thickness of the handler wafer 22 and device wafer 21, and the nature of the semiconductor processing steps that are used to build the stack structure 40 and process the device wafer 21 for a given application.

In one embodiment of the invention, the stack structure 40 can be fabricated using a similar method as discussed above with reference to FIG. 2. Initially, the stress compensation layer 42 is formed on a surface of the handler wafer 22, followed by sequentially forming the release layer 25 and the adhesive layer 24 on the stress compensation layer 42. These layers 42, 25 and 24 are formed using suitable materials and known techniques, as discussed above. Thereafter, a standard bonding process is implemented to bond the handler wafer 22 (with the bonding structure 23 and stress compensation layer 42) to the device wafer 21 to construct the resulting stack structure shown in FIG. 4.

FIG. 5 schematically depicts a stack structure comprising a bonding structure for temporarily bonding a device wafer to a handler wafer, according to another embodiment of the invention. More specifically, FIG. 5 is a schematic side view of a stack structure 50 which is similar to the stack structure 40 of FIG. 4, except that in the embodiment of FIG. 5, the stress compensation layer 42 is formed on a surface of the handler wafer 22 opposite the surface of the handler wafer 22 on which the bonding structure 23 is formed. The adhesive layer 24, release layer 25, and stress compensation layer 42 shown in FIG. 5 may be formed of the same or similar materials as discussed above with reference to FIG. 4. However, when fabricating the stack structure 50, the stress compensation layer 42 is initially formed on a surface of the handler wafer 22, followed by formation of the bonding structure 23 on an opposite surface of the handler wafer 22.

Figure 6:
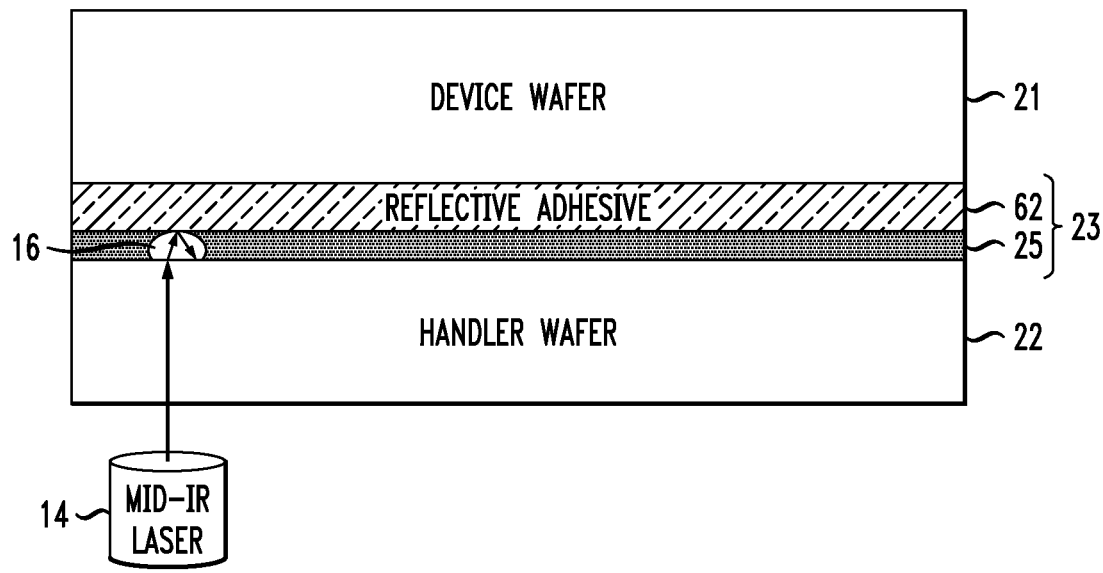
FIG. 6 schematically depicts a stack structure comprising a bonding structure for temporarily bonding a device wafer to a handler wafer, according to another embodiment of the invention.

FIG. 6 schematically depicts a stack structure comprising a bonding structure for temporarily bonding a device wafer to a handler wafer, according to another embodiment of the invention. More specifically, FIG. 6 is a schematic side view of a stack structure 60 which is similar to the stack structure 20 of FIG. 2, except that in the embodiment of FIG. 6, a reflective adhesive layer 62 is used in the bonding structure 23. More specifically, in the embodiment of FIG. 6, the reflective adhesive layer 62 is formed of a polymer adhesive material, for example, that is premixed with IR reflecting particles. The IR reflecting particles may comprise metallic particles (AL, Cu, etc.), or ceramic spheres, and/or other types of nanoparticles such as alumina, boron nitride, silica, etc., which serve to block or otherwise reflect incident Mid-IR radiation.

In this regard, the reflective adhesive layer 62 serves similar functions as the reflective layer 32 in the stack structure 30 embodiment of FIG. 3. In particular, the reflective adhesive layer 62 serves to protect the device wafer 21 from IR radiation. In addition, the reflective adhesive layer 62 serves to enhance the ablation efficiency of the release layer 25 in the laser-ablated region 16 due to the additional Mid-IR irradiation that is reflected back to the release layer 25 from the reflective adhesive layer 62, thereby reducing the ablation threshold of the release layer 25.

Moreover, when the reflective adhesive layer 62 is formed with metallic particles, or other thermally conductive materials, the thermal conductivity of the adhesive layer 62 is increased. A thermally conductive adhesive layer 62 advantageously serves to spread and dissipate heat in the stack structure 60 during various processing stages when fabricating the stack structure 60 and when processing the device wafer 21, and thereby enable high-power testing of the device wafer 21 while bonded to the handler wafer 22. The reflective adhesive layer 62 can be formed using methods as discussed below with reference to FIG. 8, for example.

Figure 7:
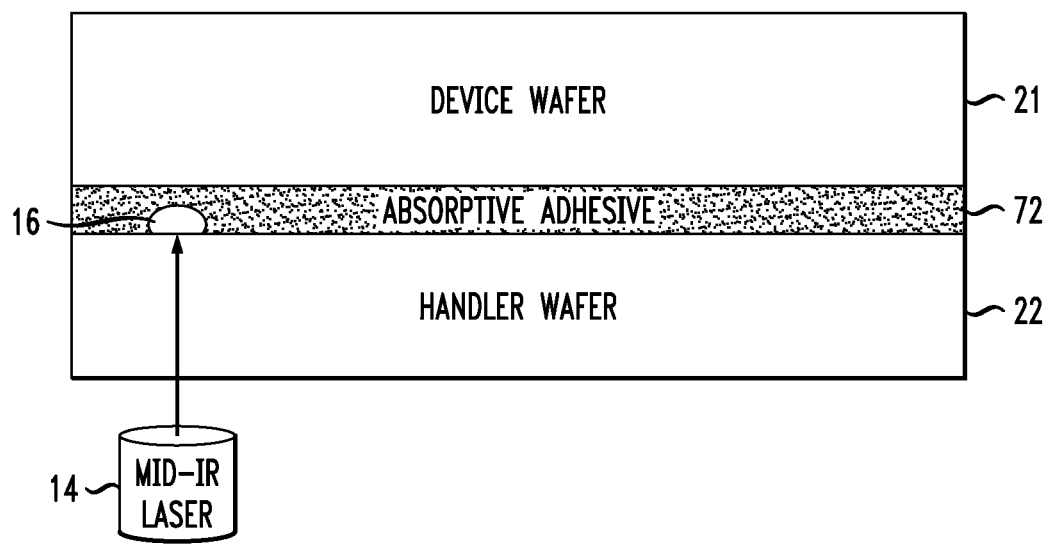
FIG. 7 schematically depicts a stack structure comprising a bonding structure for temporarily bonding a device wafer to a handler wafer, according to another embodiment of the invention.

FIG. 7 schematically depicts a stack structure comprising a bonding structure for temporarily bonding a device wafer to a handler wafer, according to another embodiment of the invention. More specifically, FIG. 7 is a schematic side view of a stack structure 70 comprising a device wafer 21 and handler wafer 22, which are bonded together using an IR absorptive adhesive layer 72. In the embodiment of FIG. 7, the absorptive adhesive layer 72 is formed of a polymer adhesive material that is premixed with metallic nanoparticles that improve the IR absorption of the adhesive material. For example, the nanoparticles may be formed of Sn, Zn, Al, carbon nanotubes or graphene, or a combination thereof. The IR absorptive adhesive layer 72 may be formed by a deposition coating process, such as spin coating or spray coating, or some other alternate form of deposition coating known in the art (or any combination of deposition coating processes), wherein the polymer adhesive material with the premixed metallic nanoparticles is deposition coated onto the surface of handler wafer 22 before bonding to the device wafer 21.

In the embodiment of FIG. 7, the IR absorptive adhesive layer 72 serves as a releasable layer by infrared ablation of the adhesive layer 72, as shown in FIG. 7. Moreover, since the absorptive adhesive layer 72 is formed with thermally conductive materials, the thermal conductivity of the adhesive layer 72 is increased which is advantageous for reasons discussed above. In other alternative embodiments, the adhesive layers 62 and 72 shown in FIGS. 6 and 7 can be utilized in place of the adhesive layers depicted in FIGS. 2, 3, 4 and 5.

Figure 8:
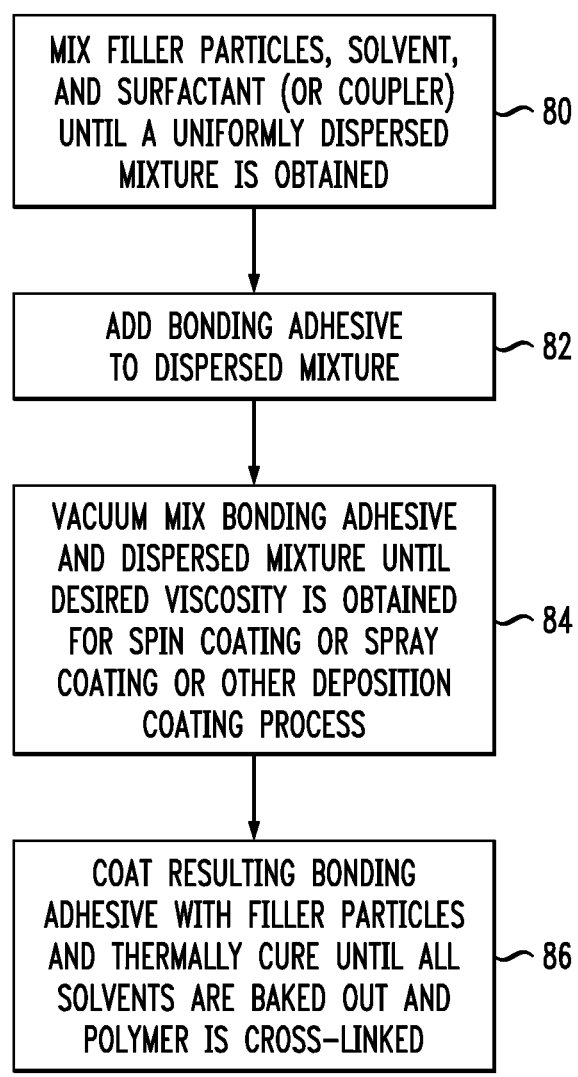
FIG. 8 illustrates a method of forming an adhesive material that is used to temporarily bond a handler wafer to a device wafer, and which enables infrared laser ablation release techniques, according to an embodiment of the invention.

FIG. 8 illustrates a method of forming an adhesive material which can be used to temporarily bond a handler wafer to a device wafer, and which supports laser ablation release techniques, according to embodiments of the invention. An initial step in forming an adhesive material includes mixing filling particles (metallic and/or non-metallic particles) with a surfactant (or coupler), and a solvent until a uniformly dispersed mixture is obtained (block 80). Methods for mixing include tip sonication, bath sonication, three-roll mixing and other suitable mixing techniques known in the art. The surfactant/coupler and solvent materials ensure that the filler particles are well dispersed, and help to obtain a stable suspension and uniform cured properties.

The type of filler particles used will vary depending on whether the temporary bonding adhesive will be used as a reflective adhesive layer (e.g., layer 62, FIG. 6) or a releasable layer (e.g., absorptive adhesive layer 72, FIG. 7). For example, when used as a reflective layer, the particles to be included in the adhesive material comprise particles or nanoparticles such as alumina, boron nitride, silica, ceramic spheres, or other similar materials. When used as an IR absorptive layer, the filler particles to be included in the adhesive material include, for example, carbon nanoparticles, aluminum nanoparticles, and/or other metallic or conductive nanoparticles. Moreover, the types of coupler/surfactant materials that are used will depend on the types of filler particles, solvent materials, and bonding adhesive materials that are used. For example, the solvent used should be capable of dissolving the bonding adhesive (polymer matrix) that is used.

A next step includes adding bonding adhesive material to the dispersed mixture of filler particles (block 82). The bonding adhesive material can be any commercially available bonding adhesive material (or matrix material) that can be reformulated using techniques as described herein to include filler particles that enable the formation of a temporary bonding adhesive that is laser-ablatable (removable), has enhanced thermal conductivity, or can serve as an IR reflecting layer. Such bonding adhesive materials include high-temperature thermoplastic polyimides, BCB, acrylics, epoxies, and other suitable adhesive materials.

The bonding adhesive material and dispersed mixture of filler particles are then vacuum mixed until a desired viscosity is obtained for spin coating (block 84). This process (blocks 80, 82, 84) results in a uniform mixture of bonding adhesive material with filler particles. For spin coating applications, a target viscosity of the temporary bonding adhesive is in a range of about $10^3$ Pa-s to about $10^5$ Pa-s, for example. Thereafter, the resulting temporary bonding adhesive material can be spin coated onto a release layer 25 (FIG. 6) or directly onto the surface of a handler wafer 22 (FIG. 7), and then thermally cured until all solvent material is baked out and the polymer material is cross-linked (block 86).

By way of example, an adhesive material according to one embodiment of the invention includes aluminum nanoparticles (e.g., 70 nm or less) added into a thermoplastic polyimide at volumetric loading in a range of about 1% to about 35%, or more preferably, about 5% to about 35%. The loading range is dependent on the percolation threshold of the particular material in the adhesive. More specifically, in one example embodiment, 10 grams of 70 nm aluminum particles, 1 mg of TritonX-100 (commercially available solvent), and 10 g of PGMEA (commercially available surfactant) are sonicated until a uniform dispersion is obtained. Then 20 g of HD 3007 (commercially available adhesive (matrix) material) is added to the mixture and mixed in a high shear mixer with a cowls blade. After a uniform mixture is obtained, the mixture is placed into a vacuum mixer and mixed until the PGMEA is evaporated and a desired viscosity of 10000 Pa-s is obtained.

It is to be appreciated that the method of FIG. 8 may be used to create a thermally conductive bonding adhesive that can be used to temporarily bond a handler wafer to a device wafer, and also serve as a release layer by itself (FIG. 7) or in conjunction with another release layer. For example, the adhesive layers depicted in FIGS. 2, 3, 4, and 5 can be a thermally conductive bonding adhesive material with IR absorbing filler particles (which is formed and deposited using methods as discussed above with reference to FIG. 8), and used as a release layer in conjunction with a thin conductive release layer made of metallic or carbon materials.

Furthermore, the use of a thermally conductive bonding adhesive to temporarily bond a handler wafer to a device wafer also provides support for high power testing of chips (dies) of the device wafer while the device wafer is bonded to the handler wafer. More specifically, a stack structure such as shown in FIG. 2, 3, 4, 5, 6 or 7, for example, having a thermally conductive adhesive layer as part of the bonding structure can serve as a thermally conducting layer that transfers heat from the device wafer to the handler wafer during high power testing of the chips on the device wafer. By way of specific example, an enhanced electrical test for a given stack structure can be implemented, wherein a thinned semiconductor device wafer is tested using wafer level test probes, while heat is removed from the device wafer through the bonding structure and silicon handler wafer to a cold plate or heat sink that is thermally coupled to the handler wafer. The stack structure provides mechanical support for built in self-test (BIST) procedures, and can also provide full power and ground delivery using test probes to electrically test the active chip circuits for frequency (speed) versus voltage, as well as other electrical test evaluations of the chip. At the same time, the stack structure with a thermally conductive adhesive layer provides enhanced cooling capabilities through the alternate side of the thinned device wafer with heat removed/spread through a thermally conductive adhesive layer and handler wafer to a cold plate or heat sink thermally coupled to the handler wafer.

FIG. 9 schematically depicts an apparatus to perform a laser debonding process to release a device wafer and handler wafer using mid-wavelength infrared energy, according to an embodiment of the invention. In particular, FIG. 9 schematically illustrates an apparatus 90 for laser scanning a stack structure 100 comprising a handler wafer 102 and device wafer 104, which are temporarily bonded using one of the exemplary bonding structures with a laser-ablatable (removable) release layer, as discussed herein. In general, the apparatus 90 comprises a Mid-IR laser source 92, a beam shaper 94, a beam raster device 96 comprising mirrors 96-1, 96-2, and a vacuum chuck 98. The components 92, 94 and 96 of the apparatus 90 are part of a laser scan system that is configured to scan a pulsed IR laser beam over the surface of the handler wafer 102 using a certain scan pattern. The infrared laser scan system controls the laser ablation scan process by controlling the power (energy density beam), the scan speed, and the pulse rate, for example, in a manner that is sufficient to effectively ablate a release layer of a bonding structure within the stack 100. The parameters of the IR laser scan can vary depending on the bonding structure framework.

More specifically, the laser beam source 92 emits a pulsed IR laser beam having a wavelength in a range of about 1.12 µm to about 5 µm, and more preferably, in a range of about 1.12 µm to about 3 µm. The beam shaper 94 focusses the Mid-IR laser beam that is emitted from the laser source 92. The focused laser beam is directed to the beam raster device 96, wherein the plurality of movable (rotating) mirrors 96-1 and 96-2 are controllably operated using known techniques to direct the pulsed Mid-IR laser beam at the stack structure 100 and quickly scan (e.g., within 20 seconds) the entire surface of the handler wafer 102 with the laser beam using one of a plurality of suitable scan patterns.

Figure 10A:
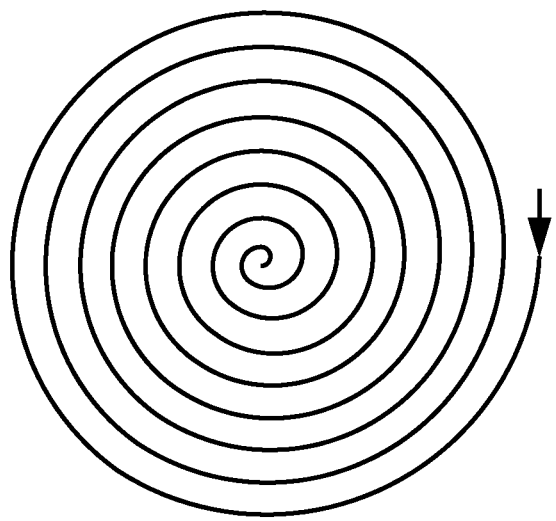
FIGS. 10A and 10B illustrate laser scan patterns that may be implemented in the apparatus of FIG. 9 to perform a laser debonding process, according to embodiments of the invention.
Figure 10B:
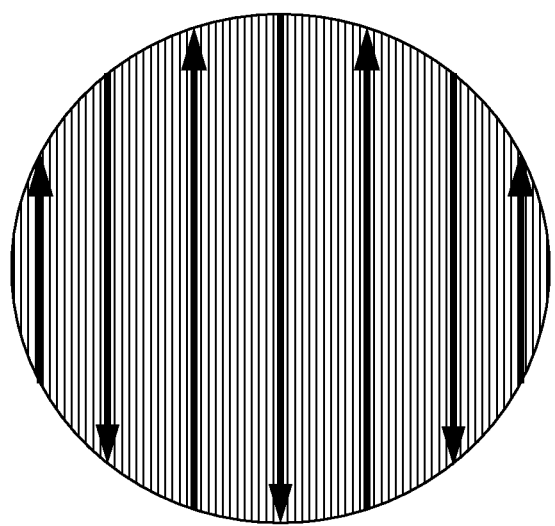

For example, FIGS. 10A and 10B illustrate laser scan patterns that may be implemented in the apparatus of FIG. 9 for performing a laser debonding process, according to an embodiment of the invention. FIG. 10A illustrates a spiral scan pattern, wherein the scan begins at the edge of the handle wafer and may be employed with multiple scan passes at the perimeter of the handle wafer and then travels in spiral direction towards the inner center of the handler wafer 102. This permits any vapor product to be exhausted from the interface of the handler wafer without causing a higher local pressure or damage to the circuit wafer. Further, FIG. 10B illustrates a serpentine scan pattern, wherein the laser beam again can be scanned at the perimeter of the wafer and then is scanned back and forth across the surface of the wafer handler 102 starting from one side of the handler wafer 102 towards an opposite side of the handler wafer 102. The laser beam scan patterns shown in FIGS. 10A and 10B allow the entire surface of the handler wafer 102 to be laser scanned such that no previously scanned surface region of the handler wafer 102 is scanned more than once for regions with underlying active circuits.

In other words, the scan patterns shown in FIGS. 10A and 10B ensure that a previously laser scanned region is not scanned again, as repeated scanning of the same region can result in damage to the device wafer when a laser beam is directed at regions in which the release layer(s) have already been vaporized. For the perimeter of the wafer (where no active circuits are underlying), one or more passes of the laser beam may be required depending the angle of the laser and any edge effects or inefficiencies due to edge effect, reflection or losses in beam contact to the release layer. Alternatively, if more than one pass of laser debonding is needed for release, a protective layer to avoid damage to the active circuits can be employed as described in this application.

FIG. 11 illustrates a method for effectively overlapping pulsed laser bean spots during an IR laser scan process to effectively ablate a release layer when performing a laser debonding process, according to an embodiment of the invention. As shown in FIG. 11, a more efficient laser scan ablation is obtained when there is some overlap of successive laser beam spots L1 and L2 in a given scan direction as indicated by arrow S. As schematically illustrated in FIG. 11, with a pulsed laser beam scan, to obtain effective overlapping of successive laser beam spots L1 and L2, the scan speed of the laser should be less than or equal to one-half the spot diameter D times the pulse frequency, i.e., $$\text{scan speed} \leq \frac{D \times \text{pulse frequency}}{2}$$

Otherwise, if there is insufficient overlapping (or no overlapping) of the laser beam spots L1 and L2, there can be regions of the releasable layer that are not properly irradiated and therefore, potentially not sufficiently ablated.

Referring back to FIG. 9, during a laser scan process, the stack structure 100 is maintained in position on the vacuum chuck 98, whereby a vacuum system applies a vacuum suction force through the vacuum chuck 98 to hold the stack structure 100 in place with the device wafer 102 in contact with the vacuum chuck 98. In one embodiment of the invention, the vacuum chuck 98 is configured to vibrate with ultrasonic or megasonic energy so as to apply vibrational forces during and/or after the laser scan to assist in the release of the handler wafer 102 from the device wafer 104. After the IR laser scan is complete, the vacuum system places a second vacuum chuck (not specifically shown) in contact with the handler wafer 102, and applies a vacuum suction force through the second vacuum chuck 120. The second vacuum chuck is lifted up with a lifting device to pull the released handler wafer 102 away from the device wafer 104. The force required to pull the handler wafer 102 away from the device wafer 104 is minimal because the release layer is substantially or completely vaporized, which effectively results in the release of the handler wafer 102 from the device wafer 104 by virtue of the laser scan ablation process.

Thereafter, the device wafer 104 can be transferred to a chemical station to etch or otherwise remove the residual temporary adhesive layer or other bonding structure materials that remain on the surface of the device wafer 104 after the debonding process. Although not shown in FIG. 9, the apparatus 90 may further comprise an air handler, filtration/condensation system or exhaust system to remove and trap debris and exhaust excess gases that are generated during the debonding process. It is to be understood that FIG. 9 is a generic, high-level structural depiction of a standard wafer-processing apparatus that can be implemented or retrofitted to perform IR laser ablation and wafer debonding, as discussed herein.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A method for forming an adhesive to temporarily bond a handler wafer to a device wafer, the method comprising:
   mixing a quantity of thermally conductive filler particles, solvent, and surfactant to obtain a first mixture in which the thermally conductive filler particles are uniformly dispersed;
   mixing a quantity of a polymer adhesive material with the first mixture to generate a second mixture; and
   vacuum mixing the second mixture to form a thermally conductive polymer adhesive material having a target viscosity that is effective for deposition coating the thermally conductive polymer adhesive material onto a handler wafer or a device wafer, and
   wherein the vacuum mixing removes the surfactant from the thermally conductive polymer adhesive material.

2. The method of claim 1, wherein the filler particles are formed of a material that absorbs infrared energy having a wavelength in a range of about 1.12 to about 5 μm.

3. The method of claim 2, wherein the filler particles comprise metallic particles.

4. The method of claim 2, wherein the filler particles comprise carbon particles.

5. The method of claim 1, wherein the filler particles are formed of a material that reflects infrared energy having a wavelength in a range of about 1.12 to about 5 μm.

6. The method of claim 5, wherein the filler particles comprise one of alumina, boron nitride, and silica particles, ceramic spheres, or a combination thereof.

7. The method of claim 1, wherein mixing the quantity of thermally conductive filler particles, solvent, and surfactant to obtain a first mixture is performed using sonication mixing.

8. The method of claim 1, wherein the target viscosity is in a range of about $10^3$ Pa-s to about $10^5$ Pa-s.

9. The method of claim 1, further comprising:
   coating a layer of the thermally conductive polymer adhesive material onto a surface of a handler wafer by spin coating, spray coating or an alternate deposition coating process; and
   thermally curing the coated layer to form a thermally conductive bonding adhesive layer with the thermally conductive filler particles to bond a device wafer to the handler wafer.

10. The method of claim 9, wherein the thermally conductive bonding adhesive layer with the thermally conductive filler particles is configured to serve as a release layer which absorbs infrared energy having a wavelength in a range of about 1.12 to about 5 and which is vaporized by absorbing the infrared energy.

11. The method of claim 1, further comprising:
   spin coating a layer of the thermally conductive polymer adhesive material onto a surface of a handler wafer; and
   thermally curing the spin coated layer to form a thermally conductive bonding adhesive layer with the thermally conductive filler particles to bond a device wafer to the handler wafer.

12. The method of claim 1, further comprising:
   spin coating a layer of the thermally conductive polymer adhesive material onto a release layer formed on a surface of a handler wafer; and
   thermally curing the spin coated layer to form a thermally conductive bonding adhesive layer with the thermally conductive filler particles to bond a device wafer to the handler wafer.

13. The method of claim 12, wherein the thermally conductive bonding adhesive layer with the thermally conductive filler particles is configured to reflect infrared energy having a wavelength in a range of about 1.12 μm to about 5 μm.

* * * * *